US012742826B2

(12) United States Patent
Duan et al.

(10) Patent No.: US 12,742,826 B2
(45) Date of Patent: Sep. 22, 2026

(54) TRACTION BATTERY CONTROLLER EMPLOYING STRUCTURAL ADAPTIVE LEARNING OF BATTERY MODEL PARAMETERS

(71) Applicant: FORD GLOBAL TECHNOLOGIES, LLC, Dearborn, MI (US)

(72) Inventors: Xiaohong Nina Duan, Canton, MI (US); Yonghua Li, Ann Arbor, MI (US); Qi Jiao, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 661 days.

(21) Appl. No.: 18/185,513

(22) Filed: Mar. 17, 2023

(65) Prior Publication Data

US 2024/0310449 A1 Sep. 19, 2024

(51) Int. Cl.

*G01R 31/3842* (2019.01)
*B60L 50/64* (2019.01)
*B60L 58/12* (2019.01)
*B60L 58/24* (2019.01)
*G01R 31/367* (2019.01)

(52) U.S. Cl.

CPC .......... *G01R 31/3842* (2019.01); *B60L 50/64* (2019.02); *B60L 58/12* (2019.02); *B60L 58/24* (2019.02); *G01R 31/367* (2019.01)

(58) Field of Classification Search

CPC .... G01R 31/3842; G01R 31/367; B60L 50/64
See application file for complete search history.

(56) References Cited

U.S. PATENT DOCUMENTS 9,065,157 B2 6/2015 Van Wiemeersch et al.
9,318,778 B2 4/2016 Wahlstrom et al.
9,440,552 B2 9/2016 Li
9,678,164 B2 6/2017 Mitsuyama et al.
12,032,035 B1 * 7/2024 Eddahech ........... G01R 31/389
2005/0029867 A1 2/2005 Wood
2012/0179435 A1 7/2012 Song et al.
2014/0278167 A1 * 9/2014 Frost ...................... B60L 58/12 702/63
2016/0059727 A1 * 3/2016 Lee ........................ B60L 53/14 903/903
2016/0103185 A1 * 4/2016 Chang ............... G01R 31/3835 324/429
2018/0017630 A1 * 1/2018 Schipfer ............. G01R 31/396
2019/0265302 A1 * 8/2019 Wang ................ G01R 31/3648
2020/0265654 A1 * 8/2020 Kapadia ................ G07C 5/004
2022/0024438 A1 * 1/2022 Vuylsteke .............. B60L 50/61

FOREIGN PATENT DOCUMENTS

CN 106814329 A 6/2017

* cited by examiner

*Primary Examiner* — Catherine T. Rastovski
*Assistant Examiner* — Sharad Timilsina
(74) *Attorney, Agent, or Firm* — David B. Kelley; Brooks Kushman P.C.

(57) ABSTRACT

A traction battery controller of an electrified vehicle controls the traction battery based in part on a value of a current-independent parameter, decomposed from a current-dependent parameter of a model of the traction battery, that is estimated based on voltage and current measurements of the traction battery. The controller may detect, based in part on the estimated value of the current-independent parameter, a power capability of the traction battery and control a vehicle component according to the power capability of the traction battery.

9 Claims, 9 Drawing Sheets

TRACTION BATTERY CONTROLLER EMPLOYING STRUCTURAL ADAPTIVE LEARNING OF BATTERY MODEL PARAMETERS

TECHNICAL FIELD

The present disclosure relates to detecting the power capability of a traction battery of an electrified vehicle.

BACKGROUND

An electrified vehicle includes a traction battery for providing power to a motor of the vehicle to propel the vehicle. The power capability of the traction battery may be monitored in controlling the operation of the vehicle and/or the traction battery.

SUMMARY

A method for a vehicle having a traction battery is provided. The method includes controlling the traction battery based in part on a value of a current-independent parameter, decomposed from a current-dependent parameter of a model of the traction battery, that is estimated based on voltage and current measurements of the traction battery.

The method may further include controlling the traction battery based further in part on a value of a second current-independent parameter, decomposed from a second current-dependent parameter of the model of the traction battery, that is estimated based on the voltage and current measurements of the traction battery. In this case, the model of the traction battery may be a resistor-capacitor (RC) equivalent circuit model having at least current-dependent parameters $R_0$ and $R_1$ and the current-independent parameters are decomposed from the current-dependent parameters $R_0$ and $R_1$, respectively.

The method may further include detecting, based in part on the estimated value of the current-independent parameter, a power capability of the traction battery and controlling a vehicle component according to the power capability of the traction battery.

The method may further include detecting, based in part on the estimated value of the current-independent parameter, a state-of-charge (SOC) of the traction battery and controlling a vehicle component according to the SOC of the traction battery.

The method may further include detecting, based in part on the estimated value of the current-independent parameter, a distance-to-empty (DTE) estimation of the vehicle and controlling a vehicle component according to the DTE estimation of the vehicle.

The method may further include decomposing the current-dependent parameter structurally into an expression involving (i) the current-independent parameter and (ii) current.

The model of the traction battery may be an equivalent circuit model (ECM) of the traction battery. The ECM may be a resistor-capacitor (RC) model having at least current-dependent parameters $R_0$ and $R_1$. In this case, the current-independent parameter is decomposed from one of the current-dependent parameters $R_0$ and $R_1$.

A vehicle having a traction battery and a controller is also provided. The controller is configured to estimate a value of a current-independent parameter, decomposed from a current-dependent parameter of a model of the traction battery, based on voltage and current measurements of the traction battery and to control the traction battery based in part on the estimated value of the current-independent parameter.

A system for a vehicle having a traction battery is also provided. The system includes a controller configured to estimate a value of a current-independent parameter, decomposed from a current-dependent parameter of a model of the traction battery, based on voltage and current measurements of the traction battery and to control the traction battery based in part on the estimated value of the current-independent parameter.

DETAILED DESCRIPTION

Detailed embodiments of the present disclosure are disclosed herein; however, it is to be understood that the disclosed embodiments are merely exemplary of the present disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
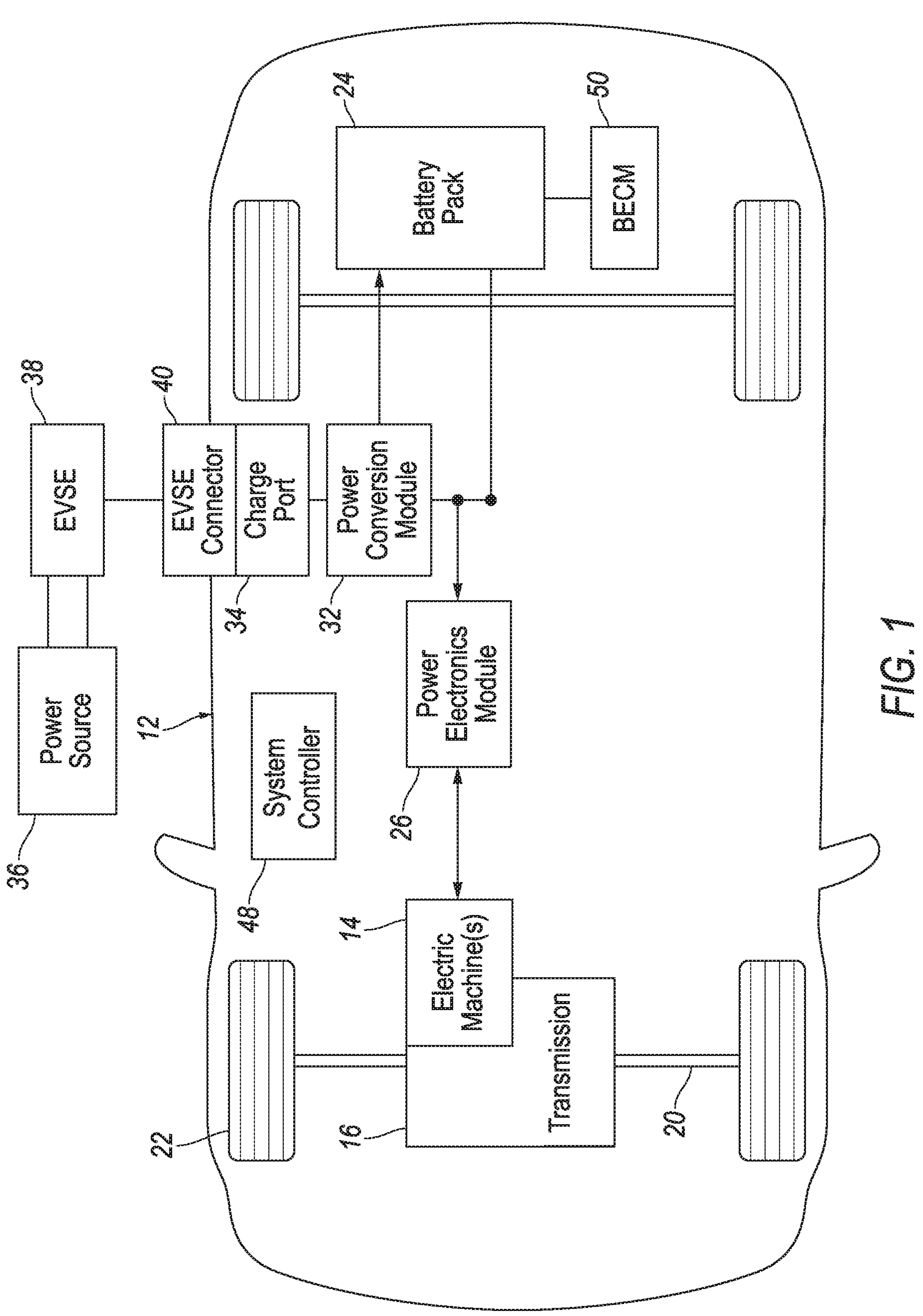
FIG. 1 illustrates a block diagram of a battery electric vehicle (BEV) having a traction battery.

Referring now to FIG. 1, a block diagram of an electrified vehicle 12 in the form of a battery electric vehicle (BEV) is shown. BEV 12 includes a powertrain having one or more traction motors ("electric machine(s)") 14, a traction battery ("battery" or "battery pack") 24, and a power electronics module 26 (e.g., an inverter). In the BEV configuration, traction battery 24 provides all of the propulsion power and the vehicle does not have an engine. In other variations, the electrified vehicle may be a plug-in hybrid electric vehicle (PHEV) further having an engine.

Traction motor 14 is part of the powertrain of BEV 12 for powering movement of the BEV. In this regard, traction motor 14 is mechanically connected to a transmission 16 of BEV 12. Transmission 16 is mechanically connected to a drive shaft 20 that is mechanically connected to wheels 22 of BEV 12. Traction motor 14 can provide propulsion capability to BEV 12 and is capable of operating as a generator. Traction motor 14 acting as a generator can recover energy that may normally be lost as heat in a friction braking system of BEV 12.

Traction battery 24 stores electrical energy that can be used by traction motor 14 for propelling BEV 12. Traction battery 24 typically provides a high-voltage (HV) direct current (DC) output. Traction battery 24 is electrically connected to power electronics module 26. Traction motor 14 is also electrically connected to power electronics module 26. Power electronics module 26, such as an inverter, provides the ability to bi-directionally transfer energy between traction battery 24 and traction motor 14. For example, traction battery 24 may provide a DC voltage while traction motor 14 may require a three-phase alternating current (AC) current to function. Inverter 26 may convert the DC voltage to a three-phase AC current to operate traction motor 14. In a regenerative mode, inverter 26 may convert three-phase AC current from traction motor 14 acting as a generator to DC voltage compatible with traction battery 24.

In addition to providing electrical energy for propulsion of BEV 12, traction battery 24 may provide electrical energy for use by other electrical systems of the BEV such as HV loads like electric heater and air-conditioner systems and low-voltage (LV) loads such as an auxiliary battery.

Traction battery 24 is rechargeable by an external power source 36 (e.g., the grid). External power source 36 may be electrically connected to electric vehicle supply equipment (EVSE) 38. EVSE 38 provides circuitry and controls to control and manage the transfer of electrical energy between external power source 36 and BEV 12. External power source 36 may provide DC or AC electric power to EVSE 38. EVSE 38 may have a charge connector 40 for plugging into a charge port 34 of BEV 12.

A power conversion module 32 of BEV 12, such as an on-board charger having a DC/DC converter, may condition power supplied from EVSE 38 to provide the proper voltage and current levels to traction battery 24. Power conversion module 32 may interface with EVSE 38 to coordinate the delivery of power to traction battery 24.

The various components described above may have one or more associated controllers to control and monitor the operation of the components. The controllers can be microprocessor-based devices. The controllers may communicate via a serial bus (e.g., Controller Area Network (CAN)) or via discrete conductors.

For example, a system controller 48 ("vehicle controller") is present to coordinate the operation of the various components. Controller 48 includes electronics, software, or both, to perform the necessary control functions for operating BEV 12. Controller 48 may be a combination vehicle system controller and powertrain control module (VSC/PCM). Although controller 48 is shown as a single device, controller 48 may include multiple controllers in the form of multiple hardware devices, or multiple software controllers with one or more hardware devices. In this regard, a reference to a "controller" herein may refer to one or more controllers.

Controller 48 implements a battery energy control module (BECM) 50. BECM 50 is in communication with traction battery 24. BECM 50 is a traction battery controller operable for managing the charging and discharging of traction battery 24 and for monitoring operating characteristics of traction battery 24. BECM 50 may implement algorithms to measure and/or estimate the operating characteristics of traction battery 24. BECM 50 controls the operation and performance of traction battery 24 based on the operating characteristics of the traction battery. The operation and performance of other systems and components of BEV 12 are controlled based on operating characteristics of traction battery 24.

Operating characteristics of traction battery 24 include the charge capacity and the state-of-charge (SOC) of traction battery 24. The charge capacity of traction battery 24 is indicative of the maximum amount of electrical energy that the traction battery may store. The SOC of traction battery 24 is indicative of a present amount of electrical charge stored in the traction battery. The SOC of traction battery 24 may be represented as a percentage of the maximum amount of electrical charge that may be stored in the traction battery.

Another operating characteristic of traction battery 24 is the power capability of the traction battery. The power capability of traction battery 24 is a measure of the maximum amount of power the traction battery can provide or receive for a specified time period. As such, the power capability of traction battery 24 corresponds to discharge and charge power limits which define the amount of electrical power that may be supplied by or to the traction battery at a given time. These limits can be provided to other vehicle controls, for example, through a vehicle system controller (VSC), so that the information can be used by systems that may draw power from or provide power to traction battery 24. Vehicle controls are to know how much power traction battery 24 can provide (discharge) or take in (charge) in order to meet the driver demand and to optimize the energy usage. As such, knowing the power capability of traction battery 24 allows electrical loads and sources to be managed such that the power requested is within the limits that the traction battery can handle.

Figure 2:
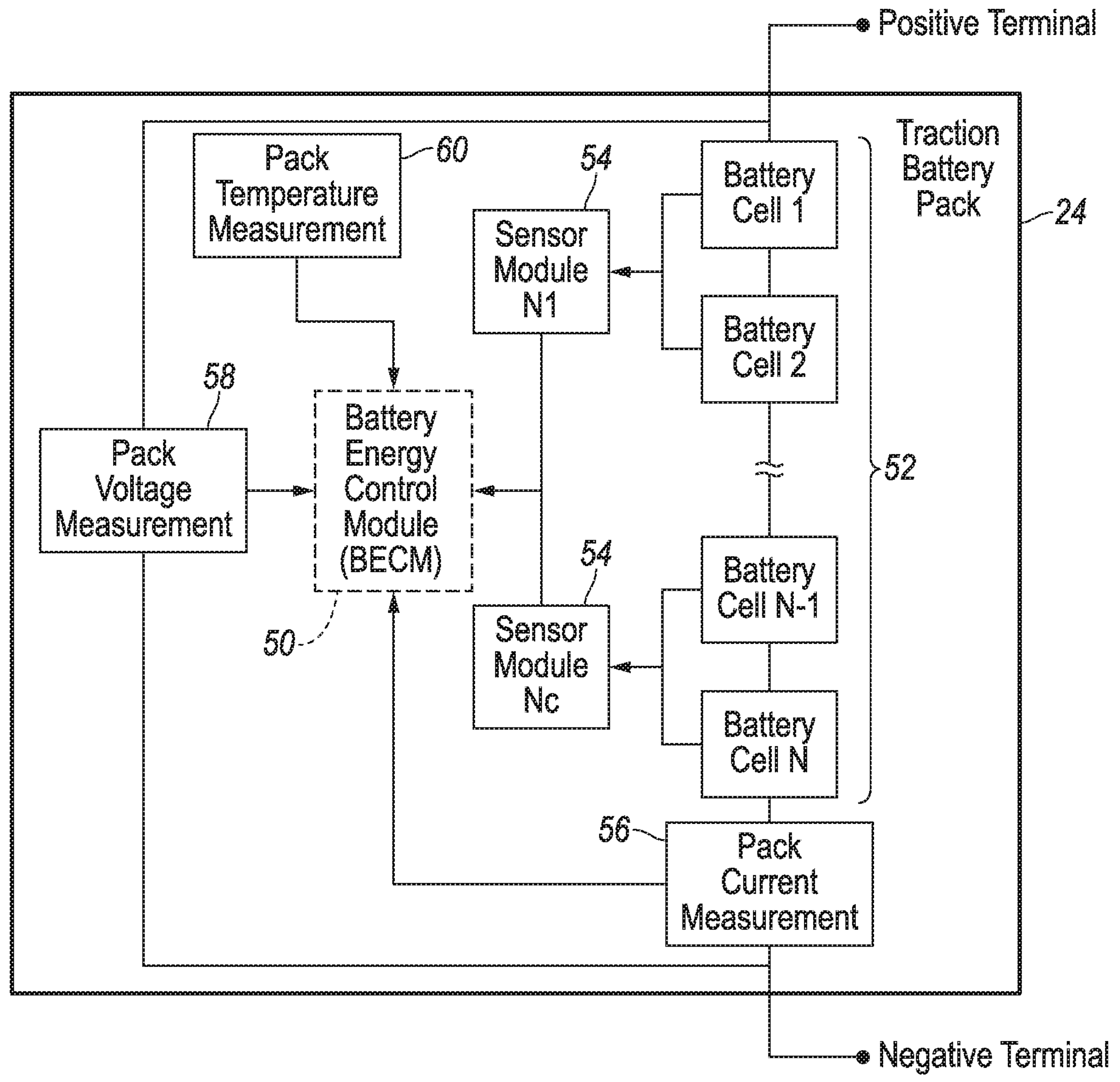
FIG. 2 illustrates a block diagram of an arrangement for a traction battery controller to monitor the traction battery.

Referring now to FIG. 2, with continual reference to FIG. 1, a block diagram of an arrangement for BECM 50 to monitor traction battery 24 is shown. Traction battery 24 is comprised of a plurality of battery cells 52. Battery cells 52 are physically connected together (e.g., connected in series as shown in FIG. 2).

BECM 50 is operable to monitor pack level characteristics of traction battery 24 such as battery current 56, battery voltage 58, and battery temperature 60. Battery current 56 is the current outputted (i.e., discharged) from or inputted (i.e., charged) to traction battery 24. Battery voltage 58 is the terminal voltage of traction battery 24.

BECM 50 is also operable to measure and monitor battery cell level characteristics of battery cells 52 of traction battery 24. For example, terminal voltage, current, and temperature of one or more of battery cells 52 may be measured. BECM 50 may use a battery sensor 54 to measure the battery cell level characteristics. Battery sensor 54 may measure the characteristics of one or multiple battery cells 52. BECM 50 may utilize Nc battery sensors 54 to measure the characteristics of all battery cells 52. Each battery sensor 54 may transfer the measurements to BECM 50 for further processing and coordination. Battery sensor 54 functionality may be incorporated internally to BECM 50.

Traction battery 24 may have one or more temperature sensors such as thermistors in communication with BECM 50 to provide data indicative of the temperature of battery cells 52 of traction battery 24 for the BECM to monitor the temperature of the traction battery and/or the battery cells. BEV 12 may further include a temperature sensor to provide data indicative of ambient temperature for BECM 50 to monitor the ambient temperature.

BECM 50 controls the operation and performance of traction battery 24 based on the monitored traction battery and battery cell level characteristics. For instance, BECM 50 may use the monitored characteristics to detect (i.e., estimate) the power capability of traction battery 24 such as for use in controlling the traction battery and/or BEV 12.

As known by those of ordinary skill in the art, BECM 50 may estimate the power capability of traction battery 24 by using an observer, whereas a battery model (i.e., "equivalent circuit model" (ECM)) is used for construction of the observer, with measurements of battery current, terminal voltage, and battery temperature. Values of parameters of the ECM may be identified through recursive estimation based on such measurements.

BECM 50 may deduce an estimate of the power capability of traction battery 24 with use of the ECM. For the power capability estimate to be accurate, the ECM has to accurately model traction battery 24. For the ECM to accurately model traction battery 24, the estimated values of the parameters of the ECM have to be at least substantially similar to the values of the parameters of an ECM that accurately models traction battery 24 (i.e., the estimated parameter values have to be at least substantially similar to the actual parameter values).

An issue is that the values of certain parameters of the ECM strongly depend on the battery current when the temperature of the traction battery is relatively cold, such as on the order of below 0° C. Battery current load of traction battery 24 ordinarily varies in a wide range during operation of BEV 12. As such, when the battery current rapidly changes while the temperature of traction battery 24 is relatively cold, the values of these certain parameters (i.e., "current-dependent" parameters) also rapidly change.

Conventional operation employed by BECM 50 treats the ECM parameters as slow changing quantities and a Kalman filter or similar variants such as an extended Kalman filter (EKF) are used to track their changes. However, no Kalman filter can track rapid current-dependent parameter changes when BEV 12 is in use. In accordance with the present disclosure, BECM 50 employs different approaches to effectively track such rapid current-dependent parameter changes when BEV 12 is in use.

As indicated, BECM 50 uses the values of the parameters of the ECM of traction battery 24 to estimate the battery power capability of the traction battery. To facilitate battery power capability estimation using ECM parameters, the correct (i.e., actual) values of the ECM parameters are to be known. Hence, there is a desire to identify ECM parameters in varying operation conditions of BEV 12 including low battery temperature. However, estimating relatively accurate ECM current-dependent parameters during rapidly changing battery current and relatively cold battery temperature operation is beyond the capability of a lumped, current-independent modeling approach conventionally used.

In accordance with the present disclosure, BECM 50 employs a structural adaptive learning (SAL) process. As part of the structural adaptive learning process, current-dependent ECM parameters are decomposed structurally into expressions involving (i) "current-independent" parameters and (ii) battery current. ("Current-independent" parameters are parameters which, for different operating conditions, either do not depend on battery current or only weakly depend on battery current in comparison with "current-dependent" parameters.)

For such current-dependent ECM parameters which strongly depend on battery current, their relationship with battery current is characterized offline as structural functions of battery current. The other ECM parameters which vary much slower than the adaption speed of online learning scheme are learned online. This allows BECM 50 to achieve correct ECM parameter estimation in all vehicle operation environments including low temperature and rapidly varying vehicle load (battery current).

As an example, an RC model (i.e., a type of ECM having a RC circuit element including a resistor ("R") parameter and a capacitor ("C") parameter) is conventionally used in the BECM power capability estimation feature. In real-world applications, such model is to be enhanced in low battery temperature environment for more accurate model parameters and battery power capability estimation.

Figure 3:
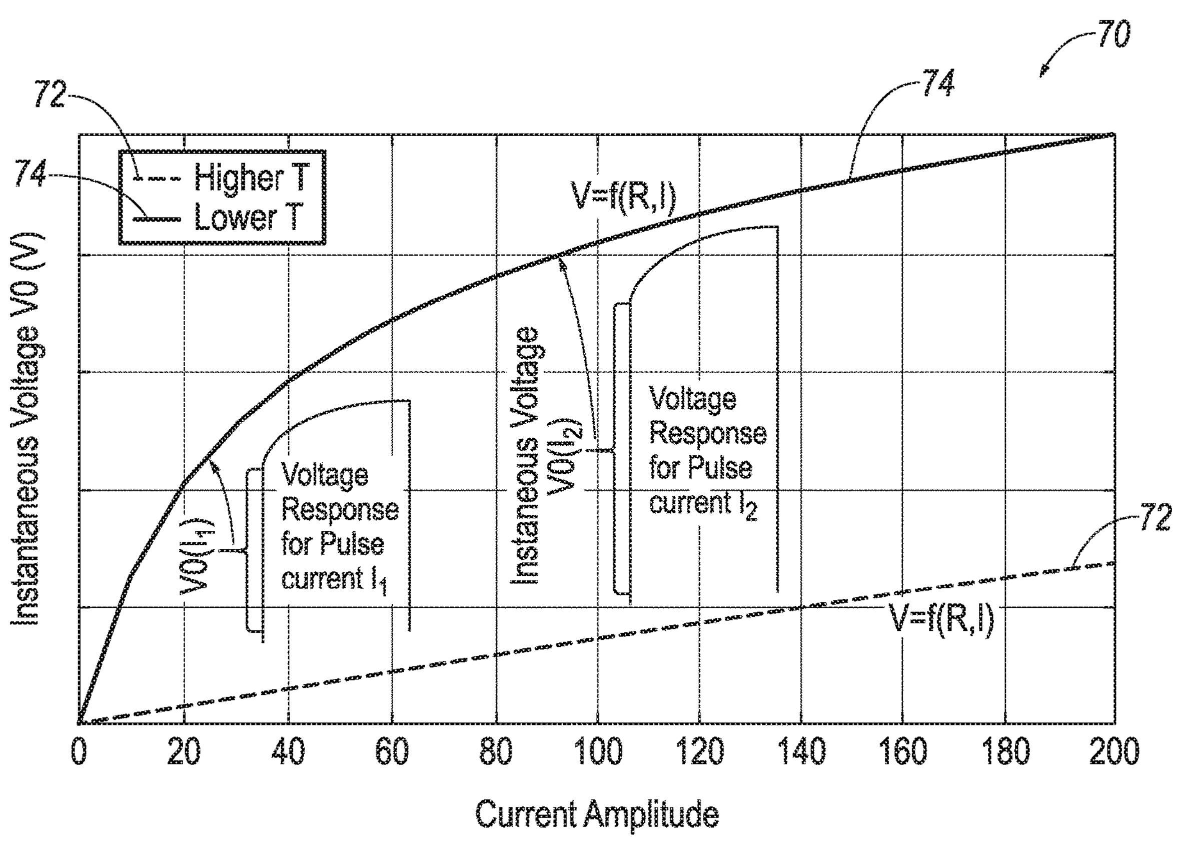
FIG. 3 illustrates a graph having a first plot of an instantaneous voltage of the traction battery versus an amplitude of a pulsed current of the traction battery when the traction battery has a non-cold temperature (e.g., a warm or hot temperature) and a second plot of the instantaneous voltage of the traction battery versus the amplitude of the battery current when the traction battery has a cold temperature.

FIG. 3 illustrates a graph 70 having a first plot 72 of an instantaneous voltage of traction battery 24 versus an amplitude of a pulsed current of the traction battery when the traction battery has a non-cold temperature (i.e., a warm or hot temperature). For instance, first plot 72 pertains to when the temperature of traction battery 24 is 25° C. Graph 70 further includes a second plot 74 of the instantaneous voltage of traction battery 24 versus the amplitude of the pulsed battery current when the traction battery has a cold temperature. For instance, second plot 74 pertains to when the temperature of traction battery 24 is −10° C.

The relationship of traction battery instantaneous voltage responses on pulsed input current amplitude in different temperatures is shown by first and second plots 72 and 74 of graph 70. As shown by first plot 72, the relationship of instantaneous voltage and pulse current amplitude is about linear in warm or hot traction battery temperatures. Conversely, as shown by second plot 74, the relationship of instantaneous voltage and pulse current amplitude is non-linear in cold traction battery temperatures.

Figure 4:
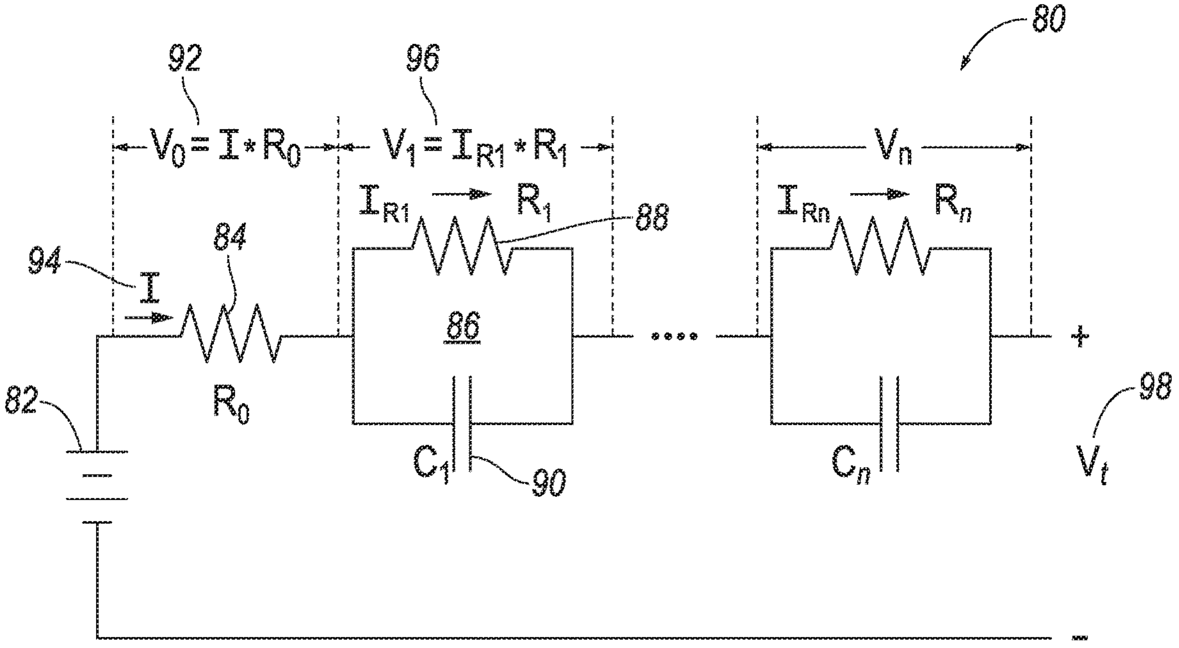
FIG. 4 illustrates a schematic diagram of an equivalent circuit model (ECM) of the traction battery.

FIG. 4 illustrates a schematic diagram of an ECM 80 for traction battery 24. Traction battery 24 may be modeled as a circuit, as indicated, and ECM 80 is one possible traction battery ECM. ECM 80 is a type of RC model.

Per ECM 80, traction battery 24 is modeled as a circuit having in series a voltage source (Voc) 82, a resistor $R_0$ 84, a first RC pair 86 having a first resistor $R_1$ 88 and a first capacitor $C_1$ 90 connected in parallel, and one or more such additional RC pairs. Voltage source 82 represents the open-circuit voltage (OCV) of traction battery 24. Resistor $R_0$ 84 represents an internal resistance of traction battery 24. The RC pairs including first RC pair 86 represent the diffusion process of traction battery 24. In this regard, first resistor $R_1$ 88 is a charge transfer resistance and first capacitor $C_1$ 90 is a double layer capacitance.

Voltage $V_0$ 92 is the voltage drop across resistor $R_0$ 84 due to battery current I 94 which flows across resistor $R_0$ 84. Voltage $V_1$ 96 is the voltage drop across first RC pair 86 due to battery current $I_{R1}$ which flows across resistor $R_1$ 88. A voltage drop is across each additional RC pair. Voltage $V_r$ 98 is the voltage across the terminals of traction battery 24 (i.e., the terminal voltage).

Parameters of ECM 80 include the resistors of the ECM (i.e., resistor $R_0$ and resistor $R_1$) and the capacitors of the ECM (i.e., capacitor $C_1$). The parameters of ECM 80 are to have values whereby the calculated output of the ECM in response to a hypothetical given input is representative of the actual output of traction battery 24 in response to the actual given input. As such, it is required that the values of the parameters of ECM 80 be accurate so that the ECM accurately models the behavior of traction battery 24.

In ECM 80, the instantaneous voltage across resistor $R_0$ is described as $V_0=I*R_0$. The $R_0$ resistance value varies with temperature, SOC, and battery current. During vehicle operation, the change of the $R_0$ resistance value caused by changes in battery temperature and SOC is much slower than that contributed by battery current. As such, the $R_0$ resistance value change is dominated by battery current variation during a relatively short time period.

Figure 5:
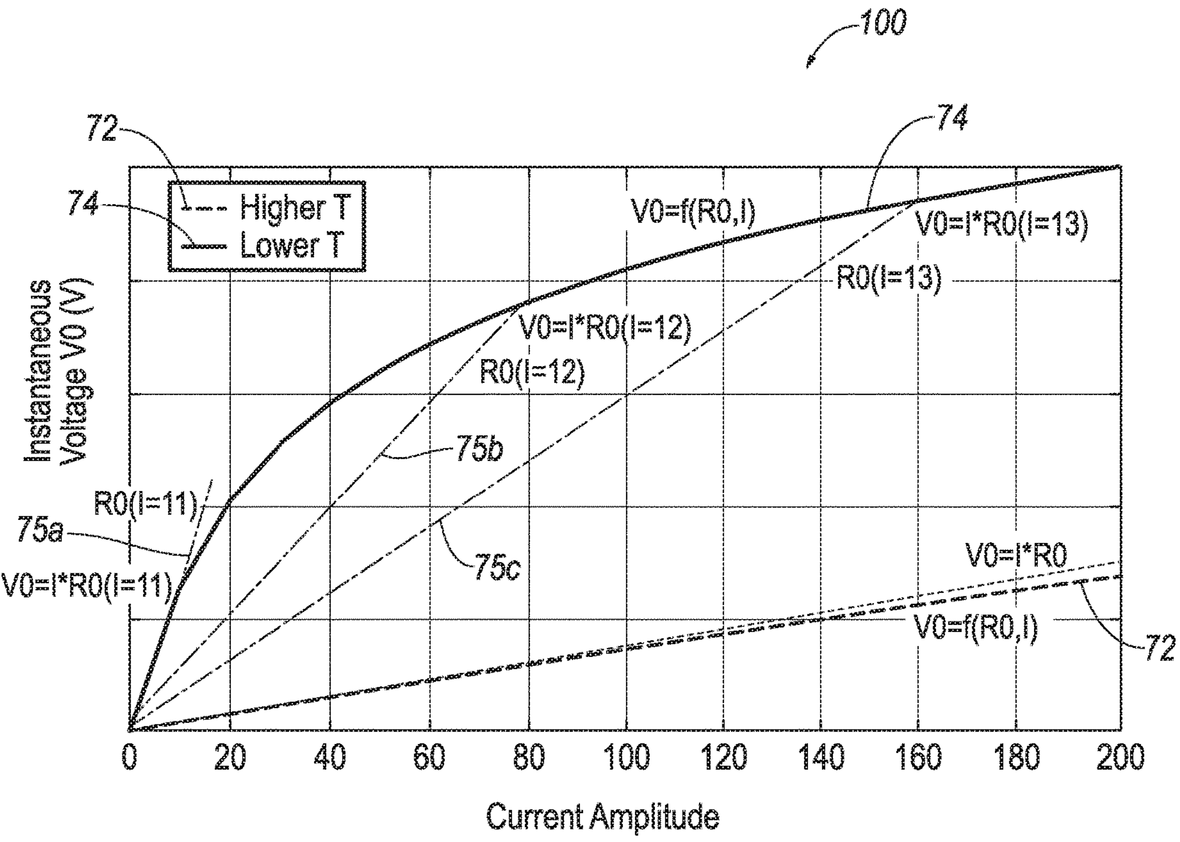
FIG. 5 illustrates a graph having the first and second plots of the instantaneous voltage of the traction battery versus the amplitude of the pulsed current of the traction battery when the traction battery has the non-cold temperature and the cold temperature, respectively, and additional plots indicative of the change in resistance value of the parameter $R_0$ of the ECM with the battery current when the traction battery has the cold temperature.

The change in resistance value of the parameter $R_0$ with battery current at different temperatures is shown in FIG. 5. In this regard, FIG. 5 illustrates a graph 100 having first and second plots 72 and 74 of the instantaneous voltage of traction battery 24 versus the amplitude of the pulsed current of the traction battery when the traction battery has a warm or hot temperature (first plot 72) and a cold temperature (second plot 74), respectively. Graph 100 has additional plots 75*a*, 75*b*, and 75*c* which are indicative of the change in resistance value of the parameter $R_0$ with battery current when traction battery 24 has the cold temperature.

As noted above, the diffusion process of traction battery 24 in ECM 80 is described with RC pairs $R_1$ and $C_1$, $R_2$ and $C_2$, . . . , Rn and Cn. Similar to parameter $R_0$, the parameters $R_1$, $R_2$, . . . Rn change with battery temperature, SOC, and battery current. Their changes are dominated by battery current variation during a relative short time period when the temperature of traction battery 24 is low (i.e., when the traction battery has a cold temperature).

When ECM 80 is used as the plant model for traction battery 24, the parameters $R_0$, $R_1$, . . . $R_n$ have to be calibrated into three-dimensional tables, which is problematic. Not only does the calibrations of the tables require a relatively large amount of test data, but also the accuracy and smoothness of $V_0$ and $R_1$ . . . Rn may be affected by the error of test and calibration. When ECM 80 model is used in BECM 50, the values of parameters $R_0$, $R_1$, . . . $R_n$, and $C_1$, $C_2$, . . . $C_n$ are estimated with some adaptive scheme such as an extended Kalman filter (EKF) during operation of BEV 12. The values of the parameters are estimated during operation of BEV 12 as the values of the parameters depend on battery temperature, SOC, and other variables such as battery life. To facilitate online estimation, the parameters are designated as state variables that can be learned with an online learning method such as a Kalman filter. For example, a single-RC model (such as the one used in a battery power capability estimation algorithm of BECM 50) is expressed as below. Here, SOC and $V_1(t)$ are states, and $R_0$, $R_1$, $\tau_1$ (where $\tau_1=R_1*C_1$) are parameters to be learned.

$$\begin{bmatrix} \frac{dSOC(t)}{dt} \\ \frac{dV_1(t)}{dt} \\ \frac{dR_0(t)}{dt} \\ \frac{dR_1(t)}{dt} \\ \frac{d\tau_1(t)}{dt} \end{bmatrix} = \begin{bmatrix} 0 & 0 & 0 & 0 & 0 \\ 0 & -\frac{1}{\tau_1} & 0 & 0 & 0 \\ 0 & 0 & 0 & 0 & 0 \\ 0 & 0 & 0 & 0 & 0 \\ 0 & 0 & 0 & 0 & 0 \end{bmatrix} \begin{bmatrix} SOC \\ V_1 \\ R_0 \\ R_1 \\ \tau_1 \end{bmatrix} + \begin{bmatrix} -\frac{1}{Q} \\ \frac{R_1}{\tau_1} \\ 0 \\ 0 \\ 0 \end{bmatrix} * I(t) + w(t)$$

$$V(t) = OCV(t) - R_0 * I(t) - V_1(t) + \mu(t)$$

$$f(SOC(t)) - R_0 * I(t) - V_1(t) + \mu(t)$$

Once the state space equations above are constructed, the corresponding EKF formulation is readily obtainable through some well-established procedure.

Figure 6:
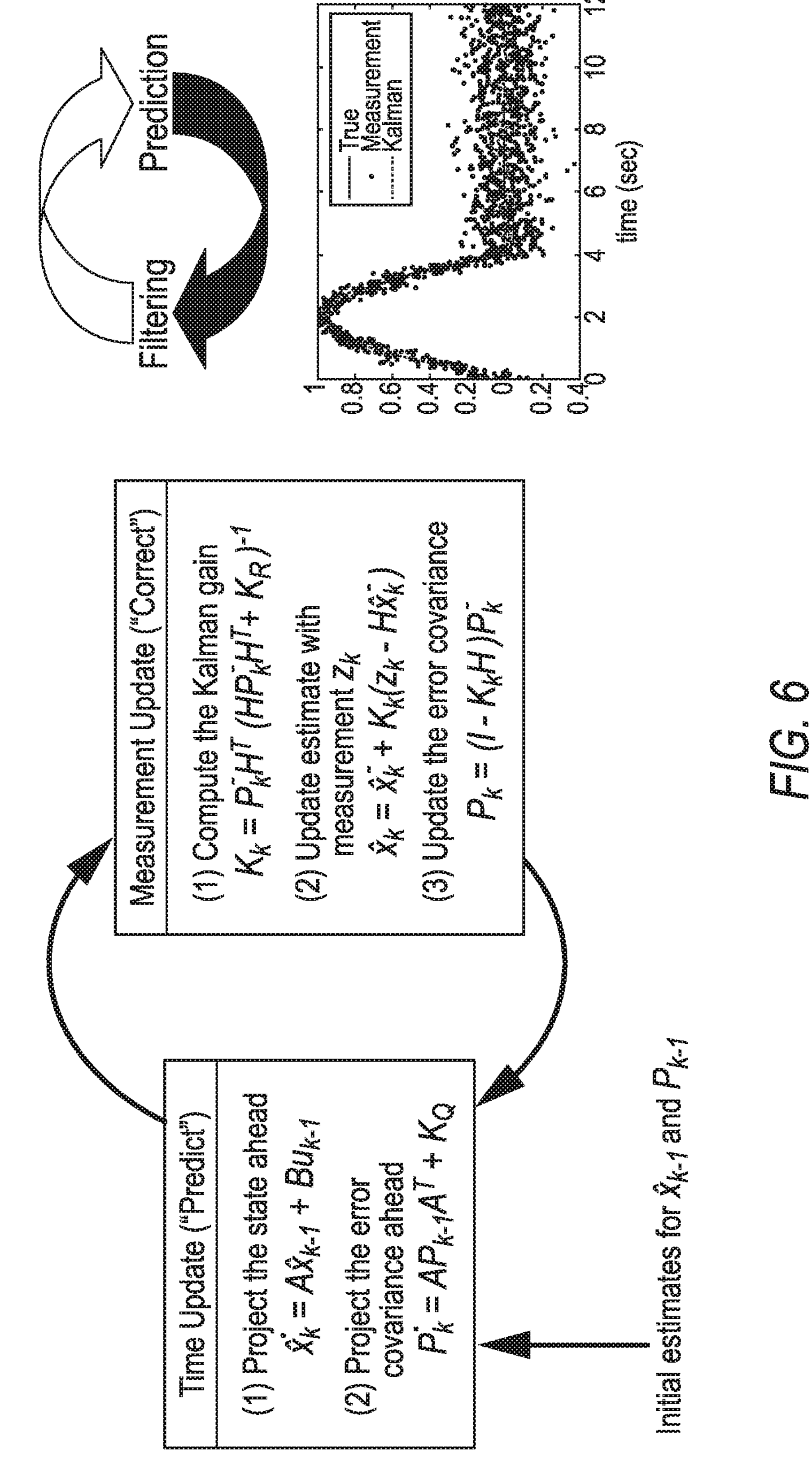
FIG. 6 illustrates a drawing depictive of configuration of an extended Kalman filter (EKF)

FIG. 6 illustrates a drawing depictive of an EKF configuration 120 which can be used to estimate the state variables. Here, the A, B, and H matrices are from the state space equations (related Jacobi matrices). The P and K matrices are for the state and measurement noise covariance matrices, and associated estimator gain choices.

Figure 7A:
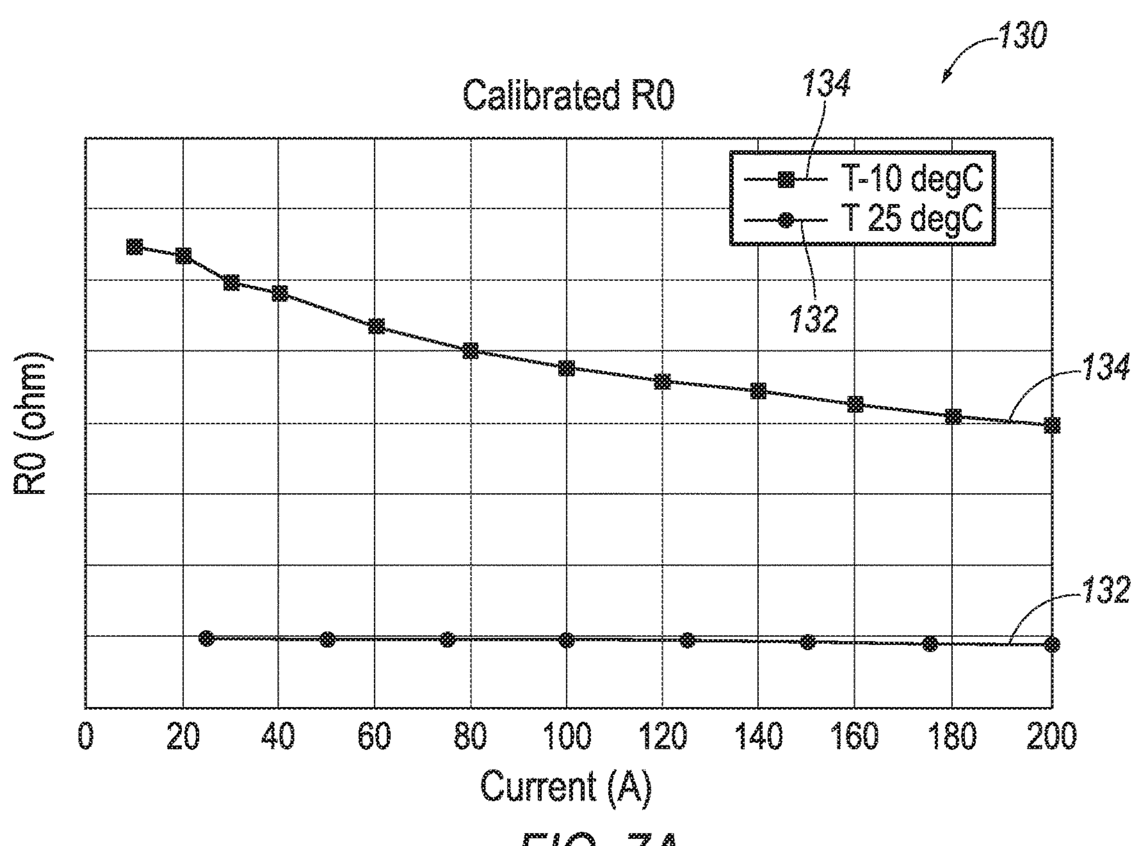
FIG. 7A illustrates a graph having a first plot of a calibrated resistance value of the parameter $R_0$ of the ECM versus battery current when the traction battery has the non-cold temperature and a second plot of the calibrated resistance value of the parameter $R_0$ of the ECM versus battery current when the traction battery has the cold temperature.
Figure 7B:
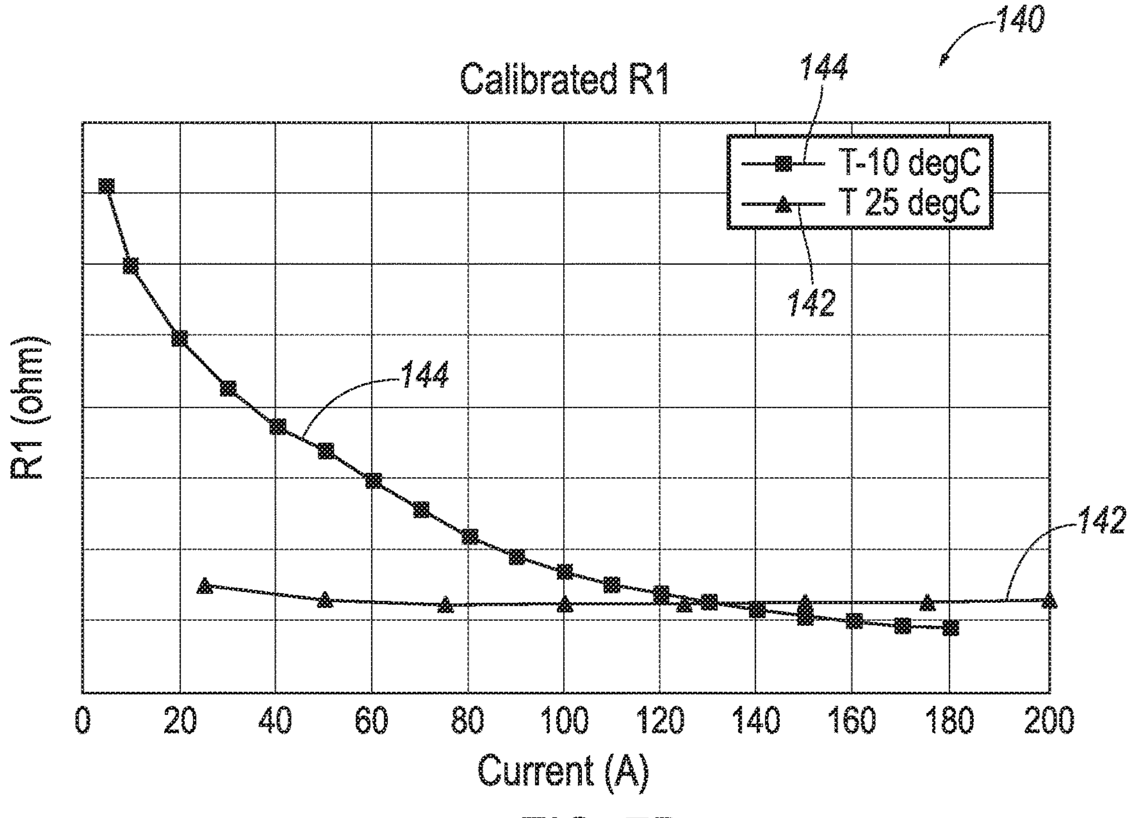
FIG. 7B illustrates a graph having a first plot of a calibrated resistance value of the parameter $R_1$ of the ECM versus battery current when the traction battery has the non-cold temperature and a second plot of the calibrated resistance value of the parameter $R_1$ of the ECM versus battery current when the traction battery has the cold temperature.

Referring now to FIGS. 7A and 7B, a first graph 130 and a second graph 140 of the resistance value of the parameters $R_0$ and $R_1$ versus battery current when the traction battery has the non-cold temperature (e.g., 25° C.) and the cold-temperature (e.g., −10° C.) are shown, respectively. Particularly, FIG. 7A illustrates a graph 130 having a first plot 132 of a calibrated resistance value of the parameter $R_0$ versus battery current when traction battery 24 has the non-cold temperature and a second plot 134 of the calibrated resistance value of the parameter $R_0$ versus battery current when the traction battery has the cold temperature. FIG. 7B illustrates a graph 140 having a first plot 142 of a calibrated resistance value of the parameter $R_1$ versus battery current when traction battery 24 has the non-cold temperature and a second plot 144 of the calibrated resistance value of the parameter $R_1$ versus battery current when the traction battery has the non-cold temperature.

ECM 80 works properly when traction battery 24 is operating within a temperature range encompassing warm or hot temperatures (e.g., temperatures falling within a "non-cold" temperature range of above 10° C. to 80° C.). The power capability of traction battery 24, which BECM 50 derives with the estimated parameters and states, can achieve satisfactory accuracy within the non-cold temperature range. In particular, within the non-cold temperature range, the resistance value of each parameter $R_0$ and $R_1$ depends weakly on battery current, as shown by plot 132 in graph 130 of FIG. 7A and by plot 142 in graph 140 of FIG. 7B.

On the other hand, estimation of the resistance value of the parameters $R_0$ and $R_1$ becomes problematic in the "cold" temperature region (e.g., temperatures below 10° C.) at which the resistance value of the parameters $R_0$ and $R_1$ depend heavily on battery current. There are at least two reasons why current-dependent parameters of ECM 80, such as the parameters $R_0$ and $R_1$, cannot be easily learned online in the cold temperature range. One is that in order to learn the parameters, the input to the system (i.e., the battery current) has to provide enough "excitation" to the dynamics of traction battery 24. The other is that the ECM parameters are normally dependent on battery current, in particular when the operating temperature of traction battery 24 is cold.

Figure 8:
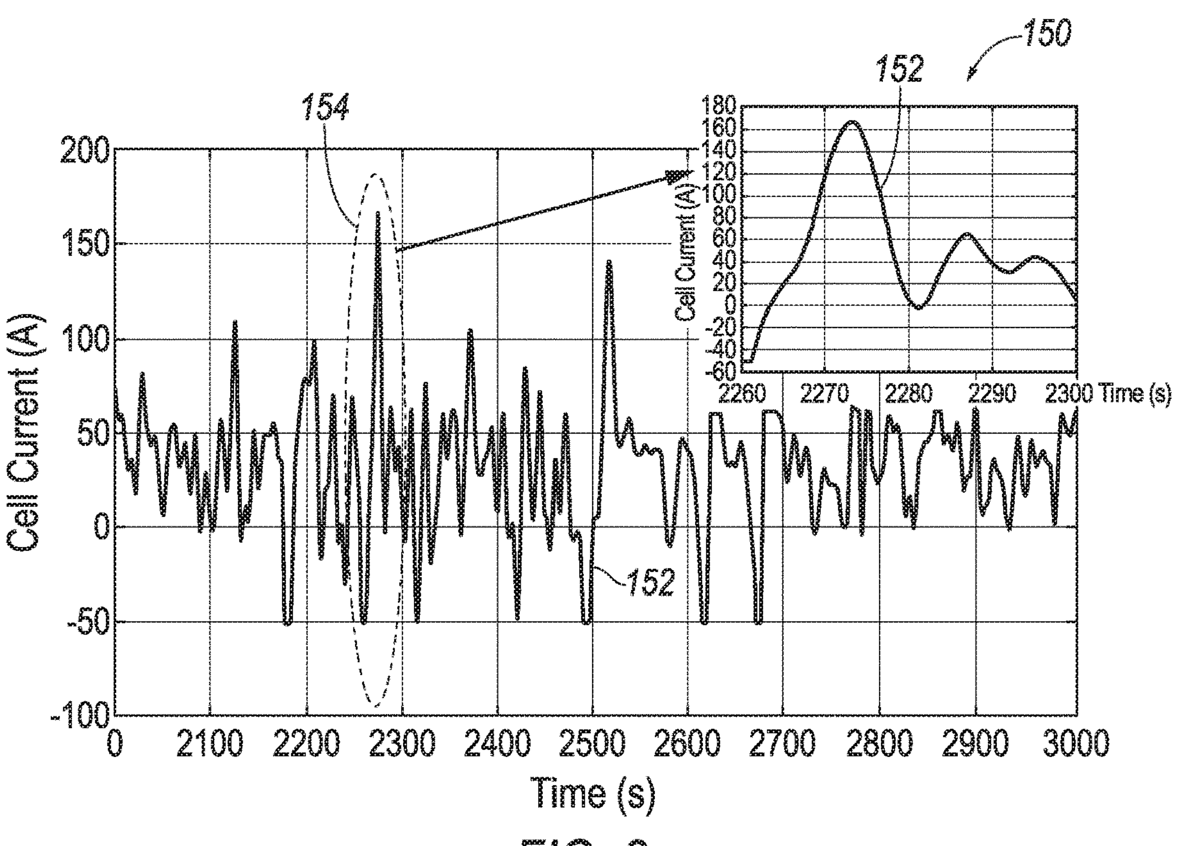
FIG. 8 illustrates a first graph having a plot of the battery current load of the traction battery during a typical electrified vehicle application and a second graph of an enlarged portion of the plot of the battery current load.

Referring now to FIG. 8, a first graph 150 having a plot 152 of the battery current load of traction battery 24 during a typical electrified vehicle application and a second graph of an enlarged portion 154 of battery current load plot 152 are shown. The fidelity of estimation results is dependent on system input, estimated parameter variation speed, as well as controller (BECM) sampling rate, among other factors. The ECM parameter variation range and speed are dependent on battery loads and battery working environment. Typical battery current variations with time are shown by battery current load plot 152. Particularly, plot 152 illustrates that the battery current may change from 0 A to 170 A in ten seconds and from 170 A back to 0 A in another eight seconds. In a cold traction battery temperature such as −10° C., corresponding to this current variation, the $R_0$ value variation is shown by plot 134 of graph 130 of FIG. 7A. The value of $R_0$ may decrease more than 30% in the first ten seconds and then increase more than 50% in the next eight seconds while the temperature and SOC remain almost unchanged. Adaptive online learning cannot follow such rapid parameter change speed due to the learning speed limit by hardware (sampling rate, CPU capability, among other factors).

Figure 9:
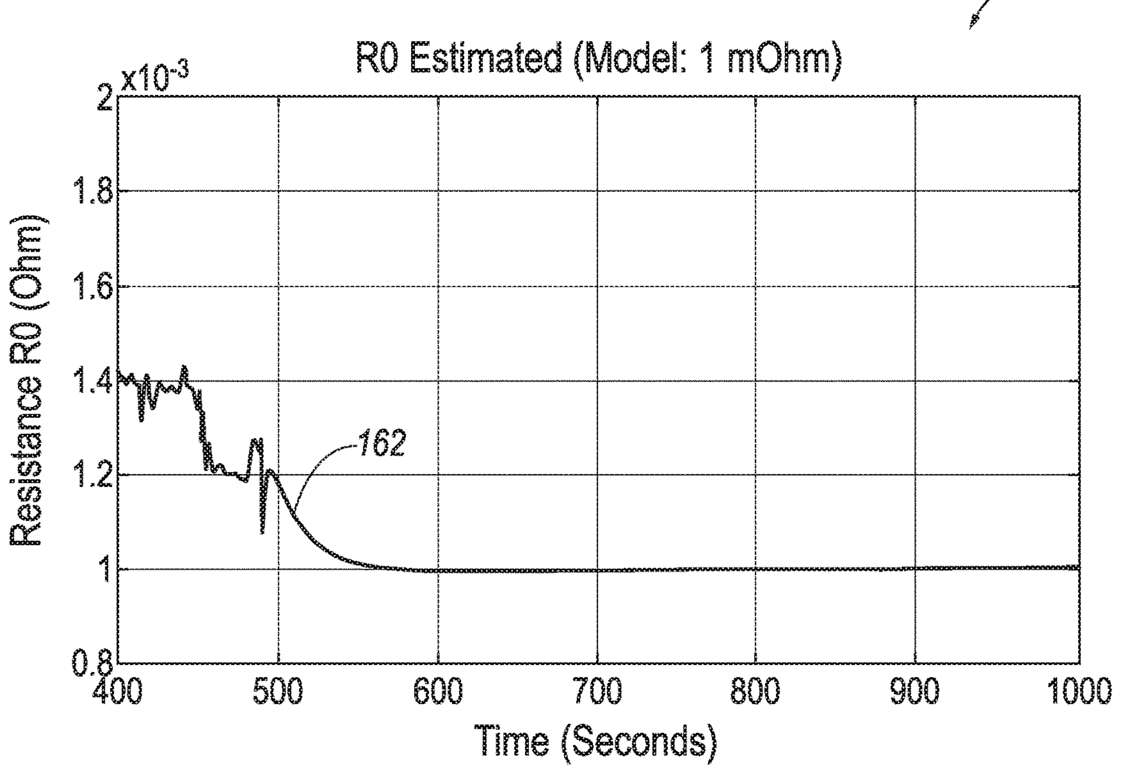
FIG. 9 illustrates a graph having a plot of the estimation conversion process for the resistance value of the parameter $R_0$ of the ECM.

FIG. 9 illustrates a graph 160 having a plot 162 of the estimation conversion process of the parameter $R_0$ of ECM 80. The estimation conversion process of the parameter $R_0$ shown by plot 162 occurs during which the parameter to be estimated is 140% greater than its true value. Plot 162 is provided to explain that EKF learning has a speed limit.

One example used to demonstrate the speed of the adaptive learning of the EKF method for a simple single-RC model of ECM 80 with fixed parameters will now be discussed. From plot 162, it is seen that for the actual value of $R_0$=1 mOhm, although the initial $R_0$ value is about 1.4 mOhm, after 550 seconds the estimated value approaches the actual value. That is, after 550 seconds, the estimated value (1 mOhm) is equal to the actual value. This means that the adaptive learning speed is much slower than that of the $R_0$ value change. In the entire drive cycle indicated by plot 152 of graph 150 FIG. 8, the $R_0$ value keeps changing with current load and the variation speed is much faster than possible BECM parameter learning speed. The end result is that the BECM is unable to follow the current change and to estimate the correct (i.e., the actual) $R_0$ value. Same problem occurs for the parameter $R_1$, with reference to plot 144 of graph 140 of FIG. 7B. The parameter $R_1$ value may change several times in about ten seconds at −10° C. The adaptive learning speed of the BECM is much slower compared with $R_1$ value change.

Per the foregoing, the significant variation of the resistance values of the parameters $R_0$ and $R_1$ with battery current when the traction battery has a cold temperature is a reason that the $R_0$ and $R_1$ values estimated by conventional vehicle control systems may differ greatly from the actual $R_0$ and $R_1$ values. Consequently, the estimated $R_0$ and $R_1$ values cannot be used to provide sufficiently accurate battery power capability estimation.

In accordance with the present disclosure, BECM 50 implements a "structural adaptive learning" process. The structural adaptive learning process involves BECM 50 decomposing the $R_0$ and $R_1$ parameters structurally into expressions involving (i) current-independent parameters and (ii) battery current. The structural adaptive learning process further involves BECM 50 using adaptive learning to learn the current-independent parameters. In this way, the current-independent parameters are learned instead of learning the parameters $R_0$ and $R_1$ directly. BECM 50 uses the learned current-independent parameters to estimate the parameters $R_0$ and $R_1$. For instance, BECM 50 uses some nonlinear mapping (e.g., (a0, a1, a2, b0, b1, b2)→mapping to $R_0$, $R_1$) to estimate the parameters $R_0$ and $R_1$ using the learned current-independent parameters.

Although a single-RC model and its $R_0$ and $R_1$ parameters are described herein to explain the structural adaptive learning process, the structural adaptive learning process is usable with multiple-RC models and other ECM parameters, such as time constant $\tau$ of RC pairs.

As indicated, a key contribution of the structural adaptive learning process implemented by BECM 50 is that the variation of ECM parameters with battery current is expressed with some structural functions, which are determined offline. The parameters that are needed to be learned online in the structural functions are independent of battery current and vary in a much slower pace than BECM online learning speed.

Figure 10:
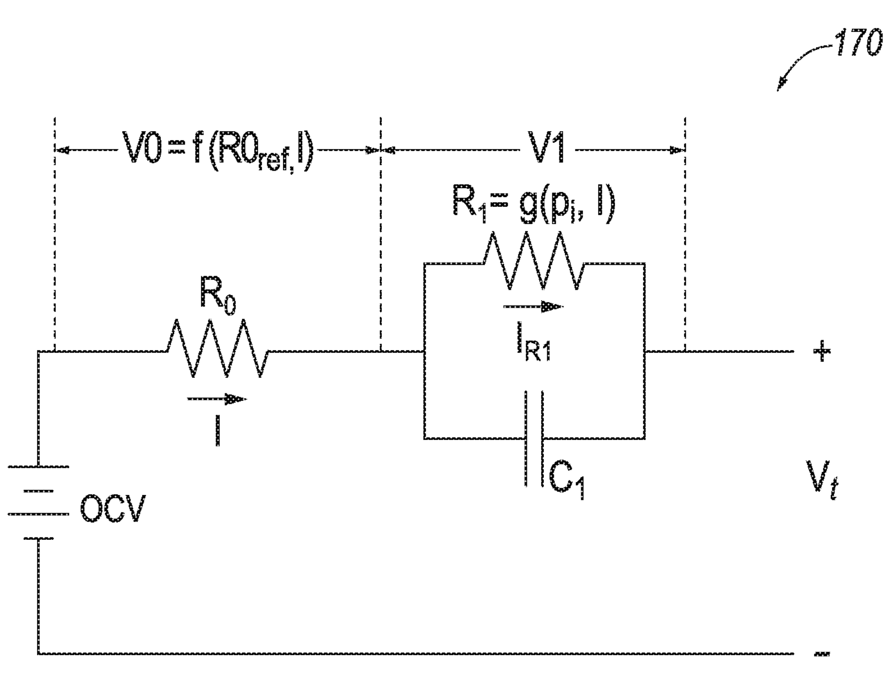
FIG. 10 illustrates a schematic diagram of a single-RC ECM of the traction battery.

To demonstrate the structural adaptive learning process, a single-RC ECM 170 for traction battery 24 is shown in FIG. 10. Again, it is emphasized that the structural adaptive learning process is applicable to multi-RC ECMs.

For the single-RC ECM 170 shown in FIG. 10, the terminal voltage of traction battery 24 can be expressed as:

$$V_t = OCV - V_0 - V_1 \quad \text{(Equation 1)}$$

The voltage $V_0$ across resistor $R_0$ can be expressed as:

$$V_0 = I * R_0$$

The voltage $V_1$ across resistor $R_1$ can be expressed as:

$$V_1 = I_{R1} * R_1$$

Alternatively, the voltage $V_1$ can be expressed as:

$$\frac{dV_1}{dt} = -\frac{1}{R_1 C_1} V_1 + \frac{1}{C_1} I$$

The above equation, with $\tau_1 = R_1 C_1$, can be expressed as:

$$\frac{dV_1}{dt} = -\frac{1}{\tau_1} V_1 + \frac{R_1}{\tau_1} I$$

As an example, per the structural adaptive learning process, two structures V0 and R1 which are expressed as functions of battery current and one or a few other parameters that are independent of battery current are proposed. The one or a few other parameters, which are independent of battery current, change with SOC, temperature, and other slower varying factors, such as battery state-of-health (SOH). These structural functions are determined offline. BECM 50 learns online the slower varying parameters with adaptive learning. (Per the adaptive learning process, although two structures V0 and R1 are provided here as examples, more structural functions of different ECM parameters can be developed.)

Proposed Structural Function V0

The voltage V0 is a structural function for the single-RC ECM 170 of traction battery 24 and is modeled as a nonlinear function of battery current and one parameter, as set forth in Equation 2 below. The one parameter is a reference resistance $\mathbf{R0}_{ref}$.

$$V0(SOC, T, I) = f(R0_{ref}(SOC, T), I) \quad \text{(Equation 2)}$$

As shown in Equation 2, the reference resistance $\mathbf{R0}_{ref}$ is function of SOC and temperature T but is independent of battery current I. As such, the reference resistance $\mathbf{R0}_{ref}$ can be expressed as "$\mathbf{R0}_{ref}$(SOC, T)". The variation of $\mathbf{R0}_{ref}$ with SOC and temperature T is much slower than the adaptive learning speed of BECM 50. Hence, it is relatively easy for the estimator (e.g., the EKF) implemented by BECM 50 to follow the reference resistance $\mathbf{R0}_{ref}$.

Figure 11:
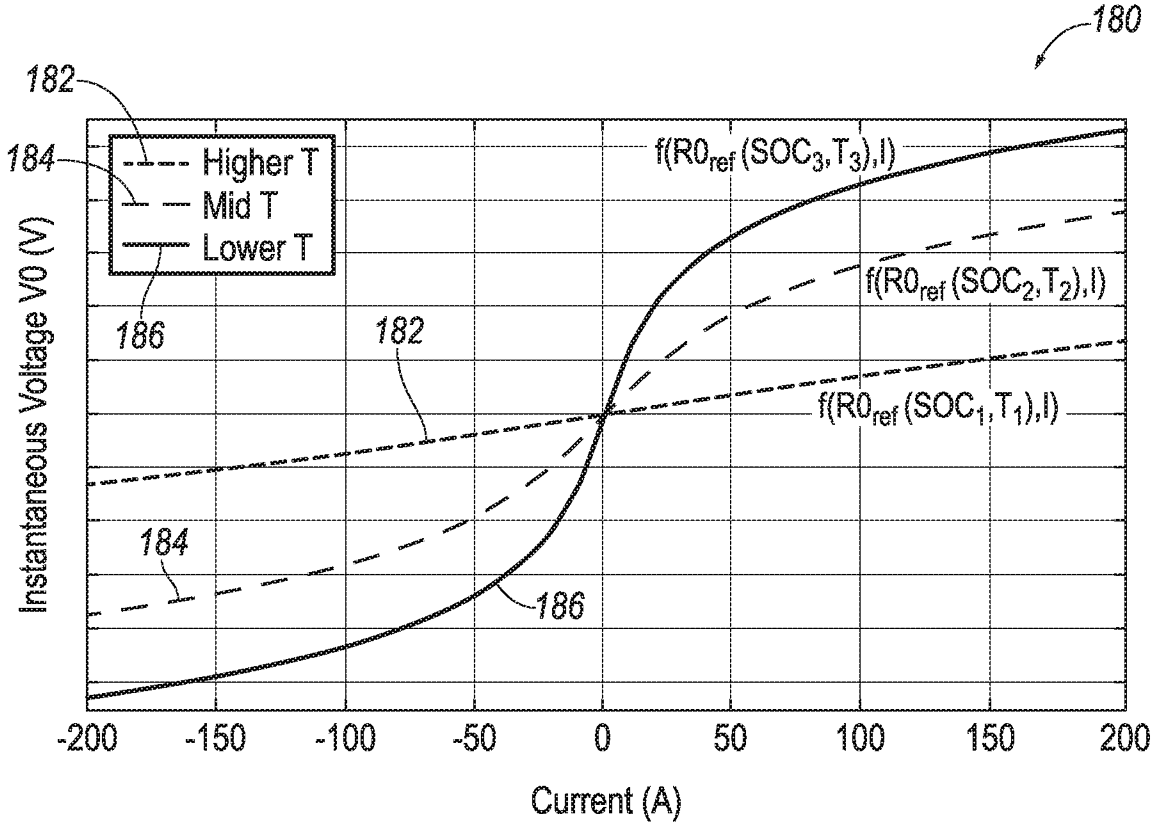
FIG. 11 illustrates a graph having a first plot of the value of a voltage V0 (the voltage V0 being a structural function for the ECM of the traction battery and is modeled as a nonlinear function of current and a parameter $R0_{ref}$) versus current of the traction battery when the traction battery has a relatively hot temperature, a second plot of the value of the structural function voltage V0 versus current of the traction battery when the traction battery has a relatively warm temperature, and a third plot of the value of the structural function voltage V0 versus current of the traction battery when the traction battery has a relatively cold temperature.

FIG. 11 illustrates a graph 180 having plots of the value of the voltage V0 versus current of traction battery 24. Particularly, graph 180 includes a first plot 182 of the value of the voltage V0 versus battery current I when traction battery 24 has a relatively hot temperature, a second plot 184 of the value of the voltage V0 versus battery current I when the traction battery has a relatively warm temperature, and a third plot 186 of the value of the voltage V0 versus battery current I when the traction battery has a relatively cold temperature. As shown, graph 180 is indicative of the structural function Vo being a nonlinear function of the reference resistance $\mathbf{R0}_{ref}$ and the battery current I.

In one implementation, the slower varying parameter $\mathbf{R0}_{ref}$(SOC, T), in identified nonlinear function of f($\mathbf{R0}_{ref}$(SOC, T), I), is the slope of the function as I→0, and satisfies the condition that:

$$R0_{ref}(SOC, T) = \left.\frac{\partial f(R0_{ref}(SOC, T), I}{\partial I}\right|_{I=0}$$

In turn:

$$V0 \approx I * R0_{ref}(SOC, T) \text{ when } I \to 0.$$

Proposed Structural Function R1

The resistance R1 is a structural function for the single-RC ECM 170 of traction battery 24 and is modeled as a nonlinear function of battery current and two parameters, as set forth in Equation 3 below. The two parameters include a first parameter $p_a$ and a second parameter $p_b$.

$$R1(SOC, T, I) = g(p_a(SOC, T), p_b(SOC, T), I) \quad \text{(Equation 3)}$$

As shown in Equation 3, the parameters $p_a$ and $p_b$ are functions of SOC and temperature T but are independent of battery current I. As such, the first parameter $p_a$ can be expressed as "$p_a$(SOC, T)" and the second parameter $p_b$ can be expressed as "$p_b$(SOC, T)". The variations of parameters $p_a$ and $p_b$ with SOC and temperature T are much slower than the adaptive learning speed of BECM 50. Hence, it is relatively easy for the estimator implemented by BECM 50 to follow the parameters $p_a$ and $p_b$.

Figure 12:
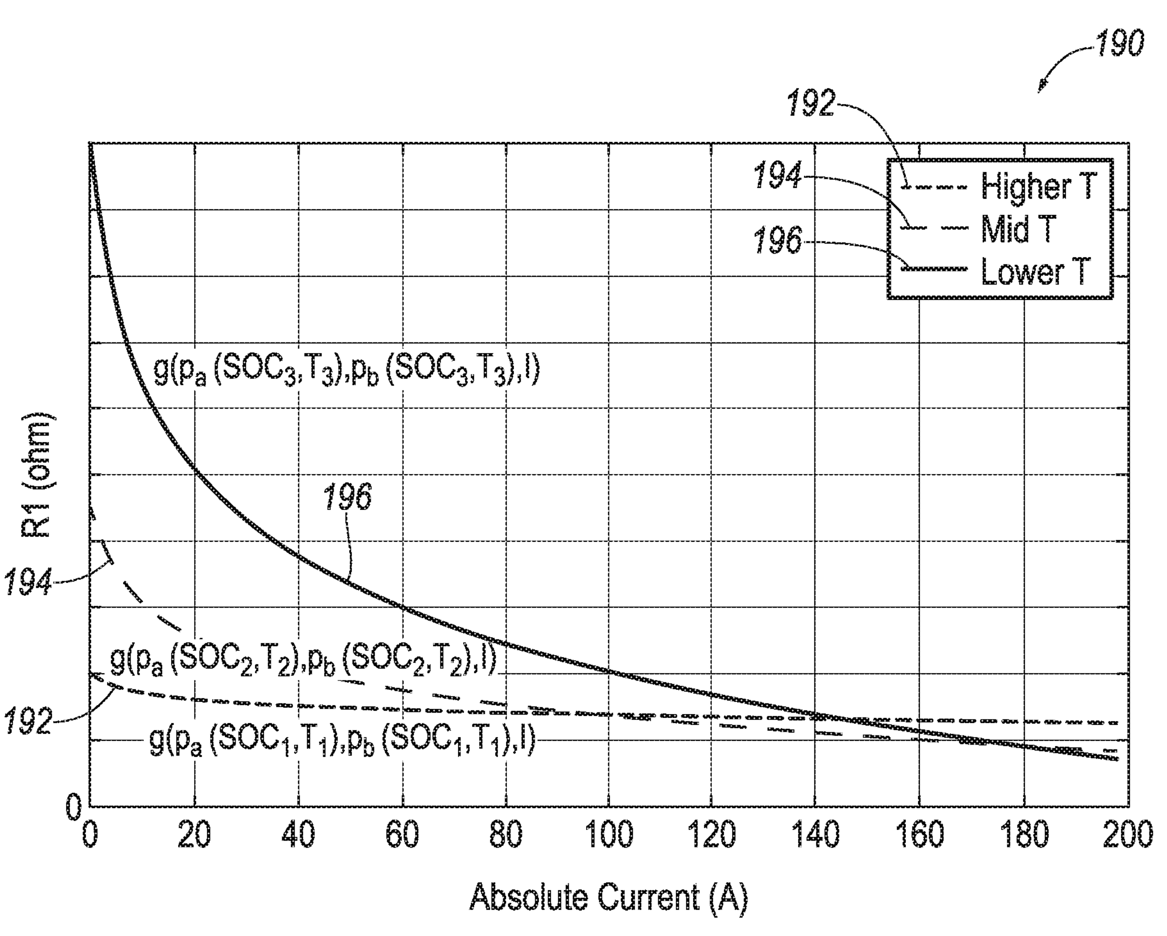
FIG. 12 illustrates a graph having a first plot of the value of a resistance R1 (the resistance R1 being a structural function for the ECM of the traction battery and is modeled as a nonlinear function of current and two parameters $p_a$ and $p_b$) versus current of the traction battery when the traction battery has the relatively hot temperature, a second plot of the value of the structural function resistance R1 versus current of the traction battery when the traction battery has the relatively warm temperature, and a third plot of the value of the structural function resistance R1 versus current of the traction battery when the traction battery has the relatively cold temperature.

FIG. 12 illustrates a graph 190 having plots of the value of the resistance R1 versus (absolute) current of traction battery 24. Particularly, graph 190 includes a first plot 192 of the value of the resistance R1 versus battery current I when traction battery 24 has a relatively hot temperature, a second plot 194 of the value of the resistance R1 versus battery current I when the traction battery has a relatively warm temperature, and a third plot 196 of the value of the resistance R1 versus battery current I when the traction battery has a relatively cold temperature. As shown, graph 190 is indicative of the structural function R1 being a nonlinear function of parameters $p_a$ and $p_b$ and the battery current I.

In one implementation, the slower varying parameter $p_a$(SOC, T), in identified nonlinear function of g($p_a$(SOC, T), $p_b$(SOC, T), I), is the value of the resistance R1 at I=0; and the slower varying parameter $p_b$(SOC, T), in the identified nonlinear function, is the partial derivative of the resistance R1 with respect to battery current I as I→0. That is, $$p_a(SOC, T) = R1(SOC, T, I)|_{I=0}$$

$$p_b(SOC, T) = \left.\frac{\partial R_1(SOC, T, I)}{\partial I}\right|_{I=0}$$

More specifically, the resistance R1 can be modeled as:

$$R1(SOC, T, I) = p_a(SOC, T) + p_b(SOC, T)\operatorname{asinh}(I) \quad \text{(Equation 4)}$$

Traction Battery Model with Structural Functions

When the structural functions of Equation 2 and Equation 3 are placed in the traction battery model Equation 1, the traction battery model is expressed as:

$$V_t(SOC,T,I) = OCV - f(R0_{ref}(SOC,T), I) - (p_a(SOC,T)\_p_b(SOC,T)a\sinh(I))I_{R_1}$$

$$\frac{dI_{R1}}{dt} = -\frac{1}{(p_a(SOC,T)+p_b(SOC,T)a\sinh(I))C_1}I_{R1} + \frac{1}{(p_a(SOC,T)+p_b(SOC,T)a\sinh(I))C_1}I$$

When the above model is converted to discrete-time difference equation, and define the state variable as X={SOC, $V_t$, $R\mathbf{0}_{ref}$, $p_a$, $p_b$, τ1}, the parameters $R\mathbf{0}_{ref}$, $p_a$, $p_b$, and τ1 can be online learned with nonlinear filter such as EKF, point filter, particle filter, etc.

The continuous time state space equations can be established as follows:

$$\begin{bmatrix} \frac{dSOC(t)}{dt} \\ \frac{dV_1(t)}{dt} \\ \frac{dR_{0ref}(t)}{dt} \\ \frac{dp_a(t)}{dt} \\ \frac{dp_b(t)}{dt} \\ \frac{d\tau_1(t)}{dt} \end{bmatrix} = \begin{bmatrix} 0 & 0 & 0 & 0 & 0 & 0 \\ 0 & -\frac{1}{\tau_1} & 0 & 0 & 0 & 0 \\ 0 & 0 & 0 & 0 & 0 & 0 \\ 0 & 0 & 0 & 0 & 0 & 0 \\ 0 & 0 & 0 & 0 & 0 & 0 \\ 0 & 0 & 0 & 0 & 0 & 0 \end{bmatrix} \begin{bmatrix} SOC \\ V_1 \\ R_{0ref} \\ p_a \\ p_b \\ \tau_1 \end{bmatrix} + \begin{bmatrix} -\frac{1}{Q} \\ \frac{p_a(SOC,T)+p_b(SOC,T)a\sinh(I)}{\tau_1} \\ 0 \\ 0 \\ 0 \\ 0 \end{bmatrix} * I(t) + w(t)$$

This can be equivalently written as:

$$\begin{bmatrix} \frac{dSOC(t)}{dt} \\ \frac{dV_1(t)}{dt} \\ \frac{dR_{0ref}(t)}{dt} \\ \frac{dp_a(t)}{dt} \\ \frac{dp_b(t)}{dt} \\ \frac{d\tau_1(t)}{dt} \end{bmatrix} = \begin{bmatrix} -\frac{1}{Q} * I(t) \\ \frac{p_a(SOC,T)+p_b(SOC,T)a\sinh(I)}{\tau_1} * I(t) - \frac{1}{\tau_1} * V_1(t) \\ 0 \\ 0 \\ 0 \\ 0 \end{bmatrix} + w(t)$$

The end result:

$$V_t(SOC,T,I) = OCV - f(R0_{ref}(SOC,T), I) - V_1 + v(t) \quad \text{(Equation 5)}$$

$$V_t(SOC,T,I) = \text{Ø}(SOC) - f(R0_{ref}(SOC,T), I) - V_1 + v(t)$$

Here: w(t) is the so-called state measurement noise, v(t) is the so-called output measurement noise, and Ø(SOC) is the SOC-OCV curve.

The above Equation 5 can then be denoted, in general, as the following nonlinear state space continuous time equations:

$$\dot{X}(t) = f_y(X(t), I(t)) + w(t)$$

$$V_t(t) = h(X(t)) + v(t)$$

Once such standard state space equations are established, the standard process of finding its EKF presentation and discretization of the presentation are relatively easy to follow.

In this case, for example, one particularly important task is to find the Jacobian matrices for both state and output equations. Here, the A and H matrices are obtained as:

$$A = \frac{\partial f_y(X(t), I(t))}{\partial X(t)}$$

$$A = \begin{bmatrix} 0 & 0 & 0 & 0 & 0 & 0 \\ 0 & -\frac{1}{\tau_1} & 0 & \frac{1}{\tau_1} * I(t) & \frac{a\sinh(I)}{\tau_1} * I(t) & \frac{1}{(\tau_1)^2}(V_1(t) - (p_a(SOC,T)+p_b(SOC,T)a\sinh(I)) * I(t)) \\ 0 & 0 & 0 & 0 & 0 & 0 \\ 0 & 0 & 0 & 0 & 0 & 0 \\ 0 & 0 & 0 & 0 & 0 & 0 \\ 0 & 0 & 0 & 0 & 0 & 0 \end{bmatrix}$$

$$H = \frac{\partial h(X(t), I(t))}{\partial X(t)}$$

$$H = \begin{bmatrix} \frac{d\text{Ø}(SOC)}{dSOC} & -1 & \frac{\partial f(R0_{ref}(SOC,T), I)}{\partial R0_{ref}} & 0 & 0 & 0 \end{bmatrix}$$

Once these Jacobian matrices are established, the EKF formulation can be directly used.

On a separate note, a discrete time installation can be similarly described.

In the above state function, the parameters to be identified are independent of current, and their variations with SOC and T are relatively slow. The EKF has been proven to track slow changing parameters with proper input. Hence, the structural adaptive learning process is capable of tracking current-dependent battery model parameters such as through the proposed structural decomposition.

It has been demonstrated with plant model simulation that the structural functions V0(SOC, T, I)=f(R0$_{ref}$(SOC, T), I) and R1(SOC, T, I)=g($p_a$(SOC, T), $p_b$(SOC, T), I) are able to accurately mimic the change of V0 and R1 with battery current with parameters R0$_{ref}$(SOC, T), $p_a$(SOC, T), and $p_b$(SOC, T) that are independent of battery current. The model implemented with these structural functions has better or equal accuracy with a model implemented with a three-dimensional table of $R_0$(I, SOC, T) and $R_1$(I, SOC, T).

One demonstration example involves an aggressive drive profile with a (cold) traction battery temperature on the order of −20° C. In this example, the current of the drive profile changes rapidly in the entire drive cycle. During drive, the traction battery temperature and SOC also change but with slower pace. In the battery model, the voltage $V_0$ across resistance $R_0$ is modeled with structural function V0(SOC, T, I)=f(R0$_{ref}$(SOC, T), I). When the battery current changes, the function V0 changes rapidly in correspondence with the variation of the battery current while the parameter R0$_{ref}$(SOC,T) does not change with the battery current. The same is true for the structural function R1(SOC, T, I). In the battery model, the voltage $V_1$ across resistor R1 is modeled with structural function R1(SOC, T, I)=g($p_a$(SOC, T), $p_b$(SOC, T), I). When the battery current changes, the function R1 changes rapidly in correspondence with the variation of the battery current while the parameters $p_a$(SOC, T) and $p_b$(SOC, T) do not change with the battery current.

As described, the present disclosure provides a structural adaptive learning process. BECM 50 implements the structural adaptive learning process to adaptively learn current-dependent parameters of an equivalent circuit model (ECM) of the traction battery. Such current-dependent parameters depend relatively strongly on battery current when the traction battery operates at cold temperatures. Consequently, with the structural adaptive learning process, performance of the ECM is enhanced for cold traction battery temperatures.

In further detail, as described, the significant variation of the resistance values of the resistors $R_0$ and $R_1$ of a typical ECM (i.e., current-dependent ECM parameters) with battery current in cold traction battery temperatures is a reason that the $R_0$ and $R_1$ values estimated by conventional vehicle control systems may differ greatly from the actual $R_0$ and $R_1$ values. Consequently, the estimated $R_0$ and $R_1$ values cannot be used to provide sufficiently accurate battery power capability estimation. The structural adaptive learning process solves this problem by decomposing the parameters $R_0$ and $R_1$ into expressions involving (i) current-independent parameters and (ii) battery current. Adaptive learning is then used to learn the current-independent parameters instead of directly learning the parameters $R_0$ and $R_1$.

As described, features of the structural adaptive learning process include the following. For an ECM representing a traction battery (pack or cell), the variation of ECM parameters are decomposed structurally into expressions involving (i) current-independent parameters and (ii) current. The variation of the ECM parameters with current is expressed with some structural functions which are determined offline. The current-independent parameters that are to be learned online in the structural functions are independent of current and vary with a much slower speed than BECM online learning speed. A voltage V0 is modeled as a nonlinear function of current and a parameter R0$_{ref}$ instead of I*$R_0$ as conventionally used. A resistance R1 is modeled as a function of current and other parameters that are independent of current but vary with SOC and temperature. With the structural adaptive learning process, the BECM learns online battery model parameters that are independent of current but may change rapidly due to vehicle propulsion. The structural adaptive learning process can be expanded for use with a multi-RC ECM in which case the ECM parameters that depend on current can be modeled as a function of (i) current and (ii) one or more parameters that do not change with current (i.e., one or more current-independent parameters). With the accurate and timely estimation of battery model parameters as provided with use of the structural adaptive learning, traction battery control functions such as SOC (state-of-charge) estimation, traction battery power capability estimation, distance-to-empty estimation (DTE) will be enhanced.

As described, the structural adaptive learning process may be used in a BECM. Use of the structural adaptive learning process in a BECM can be detected by applying varying current and measuring terminal voltage through comparing the terminal voltage with the estimated terminal voltage for different model based estimation schemes such as EKF and others.

While exemplary embodiments are described above, it is not intended that these embodiments describe all possible forms of the present disclosure. Rather, the words used in the specification are words of description rather than limitation, and it is understood that various changes may be made without departing from the spirit and scope of the present disclosure. Additionally, the features of various implementing embodiments may be combined to form further embodiments of the present disclosure.

What is claimed is:

1. A method for a vehicle having a traction battery, comprising:

controlling charging and discharging of the traction battery (A) based on a value of a first current-independent parameter that does not vary with current of the traction battery during operation of the vehicle, decomposed from a first current-dependent parameter of a model of the traction battery, that is estimated based on voltage and current measurements of the traction battery, and (B) based further on a value of a second current-independent parameter that does not vary with the current of the traction battery during operation of the vehicle, decomposed from a second current-dependent parameter of the model of the traction battery, that is estimated based on the voltage and current measurements of the traction battery;

wherein the first current-dependent parameter is structurally decomposed into (i) a function of the current of the traction battery during operation of the vehicle and (ii) the first current-independent parameter, and the second current-dependent parameter is structurally decomposed into (i) a function of the current of the traction battery during operation of the vehicle and (ii) the second current-independent parameter; and wherein the model of the traction battery is an equivalent circuit model, the equivalent circuit model being a resistor-capacitor (RC) model having the first and second current-dependent parameters, and the first and second current-independent parameters are resistor parameters.

2. The method of claim 1 further comprising:

detecting, based on the estimated value of the first current-independent parameter and the second current-independent parameter, a power capability of the traction battery; and controlling a vehicle component according to the power capability of the traction battery.

3. The method of claim 1 further comprising:

detecting, based on the estimated value of the first current-independent parameter and the second current-independent parameter, a state-of-charge (SOC) of the traction battery; and controlling a vehicle component according to the SOC of the traction battery.

4. The method of claim 1 further comprising:

detecting, based on the estimated value of the first current-independent parameter and the second current-independent parameter, a distance-to-empty (DTE) estimation of the vehicle; and controlling a vehicle component according to the DTE estimation of the vehicle.

5. A vehicle comprising:

a traction battery; and a controller configured to estimate a value of a first current-independent parameter that does not vary with current of the traction battery during operation of the vehicle, decomposed from a first current-dependent parameter of a model of the traction battery, based on voltage and current measurements of the traction battery, to estimate a value of a second current-independent parameter that does not vary with the current of the traction battery during operation of the vehicle, decomposed from a second current-dependent parameter of the model of the traction battery, based on the voltage and current measurements of the traction battery, and to charge and discharge the traction battery based on the estimated values of the first current-independent parameter and the second current-independent parameter;

wherein the first current-dependent parameter is structurally decomposed into (i) a function of the current of the traction battery during operation of the vehicle and (ii) the first current-independent parameter, and the second current-dependent parameter is structurally decomposed into (i) a function of the current of the traction battery during operation of the vehicle and (ii) the second current-independent parameter; and wherein the model of the traction battery is an equivalent circuit model, the equivalent circuit model being a resistor-capacitor (RC) model having the first and second current-dependent parameters, and the first and second current-independent parameters are resistor parameters.

6. The vehicle of claim 5 wherein:

the controller is further configured to detect, based on the estimated values of the first current-independent parameter and the second current-independent parameter, a power capability of the traction battery and to control a vehicle component according to the power capability of the traction battery.

7. The vehicle of claim 5 wherein:

the controller is further configured to detect, based on the estimated values of the first current-independent parameter and the second current-independent parameter, a state-of-charge (SOC) of the traction battery and/or a distance-to-empty (DTE) estimation of the vehicle and to control a vehicle component according to the SOC of the traction battery and/or the DTE estimation of the vehicle.

8. The vehicle of claim 5 wherein:

the vehicle is a battery electric vehicle (BEV) or a hybrid electric vehicle (HEV).

9. The vehicle of claim 5 wherein:

the controller implements an extended Kalman filter (EKF) to estimate the values of the first current-independent parameter and the second current-independent parameter based on the voltage and current measurements of the traction battery.

* * * * *